(12) United States Patent
Bernier et al.

(10) Patent No.: US 7,170,187 B2
(45) Date of Patent: Jan. 30, 2007

(54) LOW STRESS CONDUCTIVE POLYMER BUMP

(75) Inventors: William E. Bernier, Endwell, NY (US); Marie S. Cole, Wappingers Falls, NY (US); Mukta G. Farooq, Hopewell Junction, NY (US); John U. Knickerbocker, Wappingers Falls, NY (US); Tasha E. Lopez, Santa Ana, CA (US); Roger A. Quon, Rhinebeck, NY (US); David J. Welsh, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,185

(22) Filed: Aug. 31, 2004

(65) Prior Publication Data

US 2006/0043608 A1     Mar. 2, 2006

(51) Int. Cl.
*H01L 23/48* (2006.01)

(52) U.S. Cl. .................. 257/784; 257/786; 257/780; 257/781; 257/737; 257/736; 257/738; 257/739; 257/734; 257/690; 257/773

(58) Field of Classification Search ........... 257/784, 257/786, 737, 736, 780, 781, 738, 739, 734, 257/690, 773
See application file for complete search history.

(56) References Cited

U.S. PATENT DOCUMENTS

| 4,888,247 | A | * | 12/1989 | Zweben et al. ............. 428/105 |
|---|---|---|---|---|
| 5,074,947 | A | | 12/1991 | Estes et al. |
| 5,237,130 | A | | 8/1993 | Kulesza et al. |
| 5,611,140 | A | | 3/1997 | Kulesza et al. |
| 5,761,048 | A | | 6/1998 | Trabucco |
| 5,805,426 | A | * | 9/1998 | Merritt et al. ............... 361/769 |
| 5,910,641 | A | | 6/1999 | Gaynes et al. |
| 6,177,729 | B1 | * | 1/2001 | Benenati et al. ............ 257/738 |
| 6,186,392 | B1 | * | 2/2001 | Ball ........................... 228/245 |
| 6,199,751 | B1 | | 3/2001 | Gaynes et al. |
| 6,259,036 | B1 | | 7/2001 | Farnworth |
| 6,297,559 | B1 | | 10/2001 | Call et al. |
| 6,323,432 | B1 | * | 11/2001 | Campbell et al. ........ 174/149 R |
| 6,331,119 | B1 | | 12/2001 | Bernier et al. |
| 6,333,104 | B1 | * | 12/2001 | Perry et al. .................. 428/328 |
| 6,337,522 | B1 | | 1/2002 | Kang et al. |
| 6,425,772 | B1 | | 7/2002 | Bernier et al. |
| 6,512,183 | B2 | | 1/2003 | Mitani et al. |
| 6,613,662 | B2 | * | 9/2003 | Wark et al. .................. 438/613 |
| 6,802,446 | B2 | * | 10/2004 | Chaudhuri et al. ....... 228/248.1 |
| 6,959,856 | B2 | * | 11/2005 | Oh et al. ..................... 228/245 |
| 2003/0201452 | A1 | * | 10/2003 | Hedler et al. ................. 257/99 |

* cited by examiner

*Primary Examiner*—Eddie C. Lee
*Assistant Examiner*—Junghwa Im
(74) *Attorney, Agent, or Firm*—Gibb I.P. Law Firm, LLC; James C. Cioffi, Esq.

(57) ABSTRACT

Disclosed is a laminated (or non-laminated) conductive interconnection for joining an integrated circuit device to a device carrier, where the conductive interconnection comprises alternating metal layers and polymer layers. In addition, the polymer can include dendrites, metal projections from the carrier or device, and/or micelle brushes on the outer portion of the polymer. The polymer layers include metal particles and the alternating metal layers and polymer layers form either a cube-shaped structure or a cylinder-shaped structure.

5 Claims, 3 Drawing Sheets

LOW STRESS CONDUCTIVE POLYMER BUMP

BACKGROUND OF INVENTION

1. Field of the Invention

The present invention generally relates to conductive interconnections and more particularly involves conductive interconnections that utilize thermoplastic conductive adhesives having metal particles therein.

2. Description of the Related Art

A variety of isotropic and anisotropic conductive adhesives have been used for chip joining applications in the past and currently. These tend to have limitations in terms of conductor size, pitch, complexity, conductivity, stability, resistance to electromigration, and long term reliability. One particular type of isotropic adhesive employs thermoplastic polymers which incorporate various metal particles in selected forms and shapes to provide an electrically conductive path between the semiconductor device and device carrier. Such adhesive bumps may be assembled using controlled application of temperature and pressure for a designated range of time to form an electrical interconnect. These interconnects can then be underfilled with epoxy-based materials to provide a permanent mechanical supporting structure to maintain the electrical interconnection for circuit package chip production.

SUMMARY OF INVENTION

In one embodiment, the invention provides a laminated conductive interconnection for joining an integrated circuit device to a device carrier, where the conductive interconnection comprises alternating metal layers and polymer layers. The polymer layers include metal particles and the alternating metal layers and polymer layers form either a cube-shaped structure or a cylinder-shaped structure. The alternating metal layers and polymer layers can be positioned substantially parallel or substantially perpendicular to the device carrier and the integrated circuit device. The polymer layers comprise a thermoset polymer (thermoplastic conductive adhesive).

In another embodiment, the invention provides a conductive interconnection that has a spherical-shaped or cylinder-shaped polymer and metal projections extending from the integrated circuit device and the device carrier. These metal projections extend partially into the polymer and can have a cone-shape (which is triangular when viewed in cross-section). The projections can extend from either or both the integrated device and the device carrier. In this embodiment, the polymer also includes metal particles.

A different embodiment comprises a similar spherical-shaped or cylinder-shaped polymer that has dendrites within the polymer. Again, the polymer includes metal particles. These dendrites comprise a coating of palladium on the silver (or alternate) metal particles and are positioned irregularly within the polymer such that they enhance the intercalation of the silver particle network.

A further embodiment again has a spherical-shaped or cylinder-shaped polymer that has bipolar or bifunctional micelle brushes on the outer surface of the polymer. One end of the micelle brushes has an affinity for the polymer and the other end of the brushes has an affinity for the integrated circuit device underbump metallurgy (UBM) and/or the device carrier pad metallurgy. Again, the polymer includes metal particles. These micelle brushes comprise self assembled particles that have enhanced adhesion with one end of the micelle brushes having an affinity for the metal and metal pads and the other end of the micelle brushes having an affinity for the polymer. An example of the metal reactive end of the micelle brushes is a thiol moiety while the opposite end of the micelle brushes may be an organic tail which reacts or associates with the polymer in the bump or underfill.

Thus, disclosed is a laminated (or non-laminated) conductive interconnection for joining an integrated circuit device to a device carrier, where the conductive interconnection comprises alternating metal layers and polymer layers. In addition, the polymer can include dendrites, metal projections from the carrier or device, and/or micelle brushes on the outer portion of the polymer. The polymer layers include metal particles and the alternating metal layers and polymer layers form either a cube-shaped structure or a cylinder-shaped structure. These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
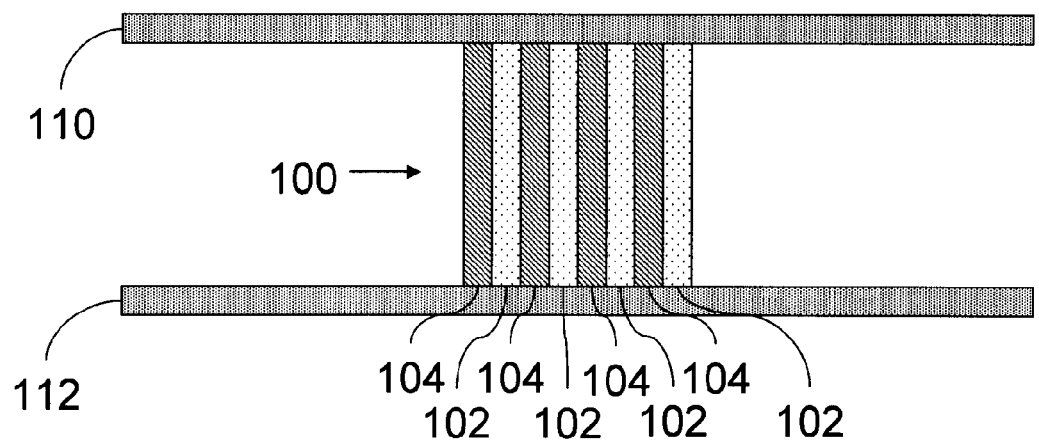
FIG. 1 is a cross-sectional schematic diagram of an interconnect structure.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As described in greater detail below, the invention utilizes a flexible polymer matrix (such as polyimide siloxane polymer matrix) containing metal particles, such as silver, nickel-iron, gold, copper, palladium, metal alloys and/or, other conductors. All such metals should be selected for low alpha emission properties so as to minimize soft errors in semiconductor devices packaged using such materials. This type of conductive interconnect is sometimes referred to as a "bump".

Such a polymer matrix can be formed by a number of different methods, such as transient liquid phase alloy reaction as disclosed in U.S. Pat. No. 6,199,751, and incorporated herein by reference. The isotropic thermoplastic conductive adhesive used with the invention can also be formulated as a screenable paste including a solvent of benzyl acetate or ethyl acetate. Alternate formulations can also be used in which conductive balls or decals can be fabricated for application to the device pads or even metal columns. The bumped device once formed can be easily stripped of the conductive adhesive by application of the benzyl acetate solvent to provide for reworkability.

Such bumped devices can be joined to various types of chip carriers such as glass, ceramic, or organic chip carriers using controlled temperature and pressure over a designated period of time, thus aligning the metal particles to form an intercalated network. This process may be assisted by application of an electrical, a magnetic, or a radio frequency field to orient and interconnect the metal particles within the polymer matrix while forming the electrical joint.

Figure 2:
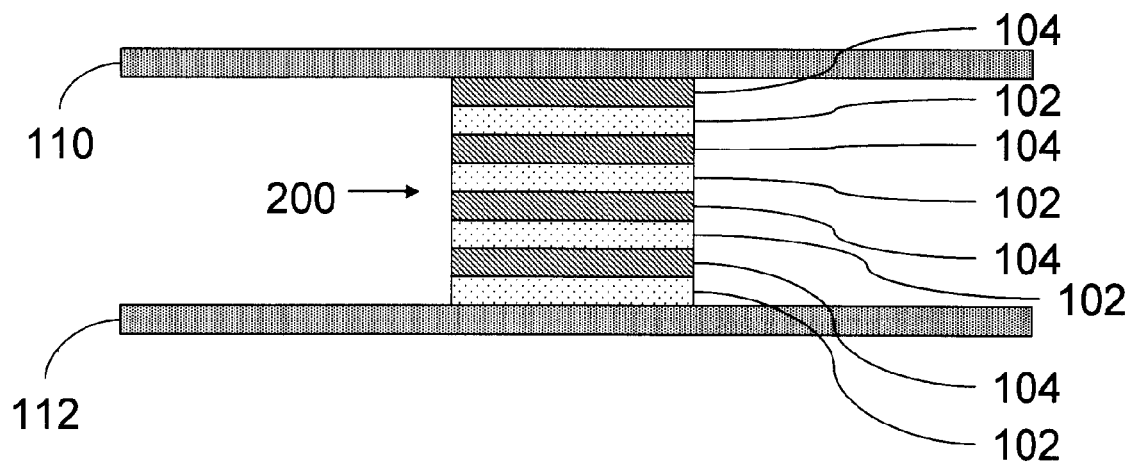
FIG. 2 is a cross-sectional schematic diagram of an interconnect structure.
Figure 3:
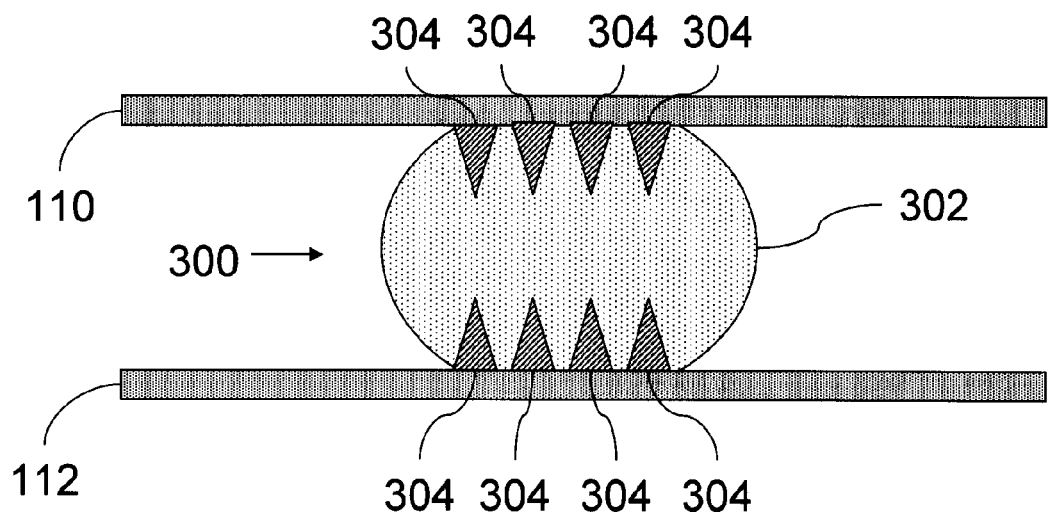
FIG. 3 is a cross-sectional schematic diagram of an interconnect structure.
Figure 4:
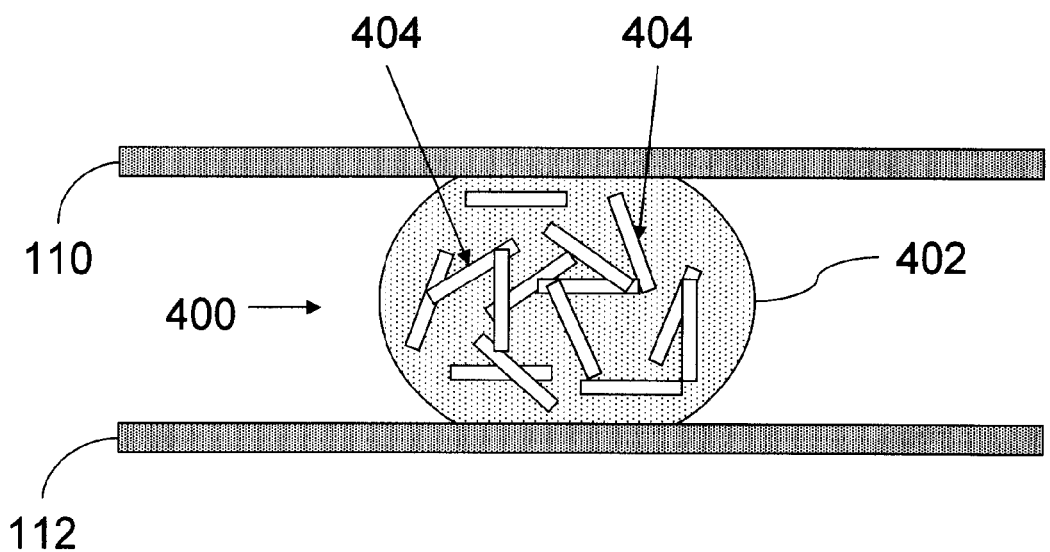
FIG. 4 is a cross-sectional schematic diagram of an interconnect structure.
Figure 5:
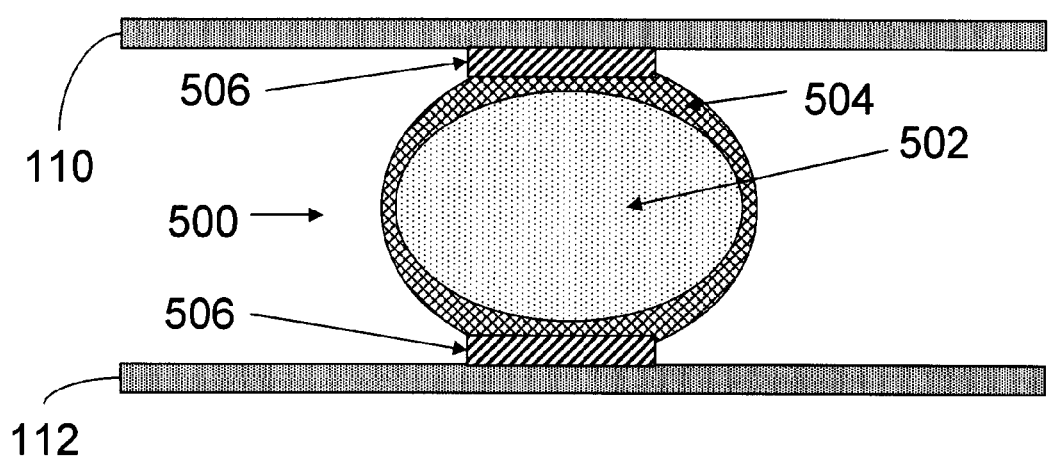
FIG. 5 is a cross-sectional schematic diagram of an interconnect structure.

With the invention, this conductive polymer may be applied in a cube or cylindrical shape (FIGS. 1–2), or a hemispherical or cylindrical shape (see FIGS. 3–5). In the drawings, items 110 and 112 represent the device (e.g., integrated circuit chip, etc.) and device carrier, respectively. Typically, the device surface 110 will be coated with a precious metal such as gold or even palladium with dendrites to enhance stability of the contact and promote conductivity.

In FIG. 1, the invention provides a laminated conductive interconnection 100 for joining an integrated circuit device 110 to a device carrier 112, where the conductive interconnection comprises alternating metal layers 104 and polymer layers 102. As shown in the drawings, the polymer layers 102 include metal particles and the alternating metal layers 104 and polymer layers 102 form either a substantially cube-shaped structure or a substantially cylinder-shaped structure. The alternating metal layers 104 and polymer layers 102 can be positioned substantially parallel or substantially perpendicular to the device carrier 112 and the integrated circuit device 110. As mentioned above, the polymer layers 102 can comprise a thermoset polymer (thermoplastic conductive adhesive).

The conductive interconnect 100 can be formed by alternately depositing/forming, the polymer 102 and metal 104 layers until the desired number of layers are formed. Then, the layers can be patterned using any conventional patterning technique (such as masking and etching) to pattern the interconnects 100 on either the device 110 or the carrier 112. Alternatively, the laminated structure can be diced and then deposited onto the device 110 or the carrier 112 and, therefore, can be positioned as shown in FIG. 1 or FIG. 2.

In another embodiment shown in FIG. 3, the invention provides a conductive interconnection 300 that has a spherical-shaped (rounded) polymer 302 and metal projections 304 extending towards the polymer from to integrated circuit device 110 and/or the device carrier 112. Each of the metal projections 304 has approximately the same height These metal projections 304 extend partially into the polymer 302 across the width of the polymer 302 and can have a cone shape (which is triangular when viewed in cross-section). The projections 304 can extend from either or both the integrated device 110 and the device carrier 112. In this embodiment, the polymer 302 also includes metal particles.

Preferably, the projections 304 are formed first on the device 110 and/or the cater 112 by depositing a metal layer and then patterning the metal layer into the projection shapes 304. Then, the polymer 302 is deposited one either the device 110 or the carrier 112 and the device 110 and the carrier 112 are then joined together.

Shown in FIG. 4 is a different embodiment that provides an interconnect 400 that has a similar spherical-shaped polymer 402 and dendrites 404 within the polymer 402. Again, the polymer includes metal particles. These dendrites 404 comprise a plated coating of palladium on the conductive metal (such as silver) and are positioned irregularly within the polymer 402. The dendrites 404 are preferably mixed with the polymer 402 before the polymer 402 is deposited on either the device 110 or the carrier 112.

A further embodiment of an interconnect 500 is shown in FIG. 5. This embodiment again has a spherical-shaped polymer 502 that has micelle brushes 504 on the outer surface of the polymer. One end of each micelle brush 504 has an affinity for the polymer 502 and the other end of the brushes 504 has an affinity for the integrated circuit device 110 and the device carrier 112. These micelle brushes 504 therefore help bond the polymer 502 to the device 110 and carrier 112 or pads 506 thereon. Again, the polymer includes metal particles. These micelle brushes may comprise a thiol or other reactive moiety at one end which may readily react with metal surfaces and an organic tail which may react or associate with the polymer matrix or underfill which act via self assembly on contact with metal and polymer. In this embodiment, the surface of the polymer bumps 502 is functionalized with chemistry 504 which readily bonds to the under-bump metallurgy, such as a-thiol chemistry to coinage metal, in order to assist in the attachment and alignment of the polymer-derived C4 bumps.

After forming any of the conductive, thermoplastic adhesive interconnects (joints) 100, 300, 400, 500, discussed above, the interconnects can be protected from mechanical damage by underfill which can be either permanent or reworkable. Once underfilled, the resulting module is as durable as structures using Sn/Pb solder joints. Further, each embodiment is not mutually exclusive to the other embodiments. Therefore, the inventive structure can include the polymer combined with the dendrites 404, the projection studs 304, the micelle brushes 502, and/or can be formed as a laminated structure or a spherical structure.

Assembly can be performed using commercially available equipment at temperatures of, for example, 220 C. The resulting joints can be reworked using solvent to dissolve the joints and reuse the chip 110 or chip carrier 112 if required. The joints, once formed, are electrically conductive and can be used for temporary chip attachment for test and rework if required. The joints incorporated into the circuit package can be made Pb-free. Therefore, they are not subject to typical problems with secondary reflow seen with lead-based solder in conventional structures. The joints can be designed as inherently low alpha emitting to minimize soft error rates in devices. Insulation resistance and stress test durability in temperature/humidity/bias and thermal cycling environments are excellent based on the ability of the conductive adhesive to encapsulate the metals within it and form a somewhat flexible electrical joint structure, which can more closely match the thermal coefficient of expansion of the underfill and organic chip carrier 112. The organic polymer adhesive forms a strong bond with the underfill such that little separation or delamination occurs during secondary thermal excursion to high assembly temperatures for card attachment and board processing. Another advantage of these structures is that the size and pitch can be easily scaled from large sizes and pitches such as 0.008/0.015 inches to 0.003/0.006 inches or smaller.

The invention provides a number of advantages compared to currently available structures. The invention uses easily processed materials with conventional formulation and application equipment. The materials are reworkable after initial application without damage to the device 110. The materials are amenable to wafer scale processing. The structures formed are mechanically stable as bumps on the wafer and can be diced using conventional equipment. The invention has enhanced mechanical strength and bonding at interfaces, enhanced structural integrity, ease of assembly.

While the invention has been described in terms of preferred embodiments, those skilled in the art will recognize that the invention can be practiced with modification within the spirit and scope of the appended claims.

What is claimed is:

1. A conductive interconnection for joining an integrated circuit device to a device carrier, said conductive interconnection comprising:
    a polymer having a spherical shape between said integrated circuit device and said device carrier; and
    micelle brushes on the outer surface of said polymer,
    wherein a first end of said micelle brushes has an affinity for said polymer so as to attach said first end to said polymer and a second end of said micelle brushes has an affinity for metal surfaces so as to attach said second end to said integrated circuit device on one side of said polymer and said device carrier on another side of said polymer.

2. The conductive interconnection in claim 1, wherein said micelle brushes comprise a reactive moiety with an organic tail.

3. The conductive interconnection in claim 1, wherein said polymer includes metal particles.

4. The conductive interconnection in claim 1, wherein said polymer comprises a thermoset polymer.

5. The conductive interconnection in claim 1, wherein said polymer comprises a thermoplastic conductive adhesive.

* * * * *